(12) United States Patent
Geho et al.

(10) Patent No.: US 6,387,178 B1
(45) Date of Patent: May 14, 2002

(54) SINGLE CRYSTAL PRODUCING METHOD AND APPARATUS

(75) Inventors: Mikio Geho, Otsu; Takenori Sekijima, Shiga-ken; Takashi Fujii, Otsu, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/716,343

(22) Filed: Nov. 20, 2000

(30) Foreign Application Priority Data

Nov. 19, 1999 (JP) ............................................. 11-329844

(51) Int. Cl.$^7$ .............................................. C30B 13/22
(52) U.S. Cl. .............................. 117/50; 117/43; 117/44; 117/51
(58) Field of Search ................................ 117/43, 44, 50, 117/51

(56) References Cited

U.S. PATENT DOCUMENTS 6,039,802 A * 3/2000 Sekijima et al. .............. 117/49
6,165,253 A * 12/2000 Sekijima et al. .............. 117/49

* cited by examiner

*Primary Examiner*—Felisa Hiteshew
(74) *Attorney, Agent, or Firm*—Dickstein Shapiro Morin & Oshinsky LLP

(57) ABSTRACT

A single crystal producing method for growing a single crystal, comprises the steps of: placing a material at one focal point in a light-condensing and heating furnace having an ellipse in section; placing a heat light source at another focal point; and emitting a laser beam has a wavelength of not less than about 160 nm and not greater than about 1,000 nm, on or near the one focal point to form a melt zone; and moving the melt zone to grow a single crystal.

18 Claims, 1 Drawing Sheet

SINGLE CRYSTAL PRODUCING METHOD AND APPARATUS

BACKGROUND OF THE INVENTION

1. Field of the Invention

The present invention relates to a single crystal producing method and apparatus, and more specifically, it relates to a production method and apparatus of a single crystal for use in optics such as optical isolators or electronic components such as microwave isolators by the light-condensing and heating method.

2. Description of the Related Art

Materials for an optical isolator include an iron garnet (for example, $Y_3Fe_5O_{12}$; hereinafter referred to as "YIG") single crystal having a large angle of Faraday rotation. Recently, the demand for small-sized and sophisticated electronic components has increased. While a polycrystal such as ceramic sufficiently worked well in the past, a single crystal having no effect of grain boundary has been required along with demands on a size reduction. A YIG single crystal is also increasingly required.

Typical methods of growing a single crystal including the CZ (Czochralski) method are well known. Of these methods, the light-condensing and heating method representative of the FZ (Floating Zone) method is advantageous in that a high purity can be maintained because the crystal need not be in contact with crucible materials, in that the growth rate can be high because a large temperature gradient can be attained, etc.

A single crystal growth method using a combination of the light-condensing and heating method and the laser heating method, which is known as the LHPG (Laser Heat Pedestal Growth) method, is published in, for example, Japanese Unexamined Patent Application Publication No. 6-048883. A single crystal producing apparatus using this method is published in Japanese Unexamined Patent Application Publication No. 7-315979. Advantageously, this method employs a laser beam as a primary heat source to provide the temperature gradient more sharply, resulting in a higher growth rate. The present inventors disclose in Japanese Unexamined Patent Application Publication No. 10-251088 a single crystal producing method (SSFZ method) which takes advantage of a self-adjusting reaction.

This method is innovative in that an incongruent melting type of single crystal can be grown while being controlled in orientation.

When a laser beam is used to melt a polycrystal raw material rod, a YAG laser is commonly used. This is because a YAG laser can easily attain a light beam having a high output as well as a high linearity. A YAG laser beam having a high output and a high linearity can be used as a heat source without any condensing instrument such as lens.

A YAG laser beam has a wavelength of 1,060 nm and thus has drawbacks with respect to low light absorption of iron garnet. Therefore, a higher laser output is required, causing a deterioration of energy efficiency to thereby increase the operating cost. Furthermore, a YAG laser device is relatively expensive, increasing the investment for equipment. For these reasons, the single crystal production becomes costly, and it is therefore difficult to offer an inexpensive single crystal.

SUMMARY OF THE INVENTION

Accordingly, the primary object of the present invention is to provide a less expensive single crystal by attaining an increased growth rate of a single crystal, and an increased production, and by lowering the investment for equipment per unit cost.

The single crystal producing method for growing a single crystal comprises the steps of: placing a material at one focal point in a light-condensing and heating furnace having an ellipse in section; placing a heat light source at another focal point;

and emitting a laser beam has a wavelength of not less than about 160 nm and not greater than about 1,000 nm, on or near the one focal point to form a melt zone; and moving the melt zone to grow a single crystal. The wavelength of the laser beam preferably has a not less than about 750 nm and not greater than about 1,000 nm, and the single crystal is preferably magnetic garnet.

According to the another aspect of the present invention, the single crystal producing apparatus for growing a single crystal comprises: a light-condensing and heating furnace having an ellipse in section and first and second focal points on which light is condensed, the light-condensing and heating furnace holding a material stick at the first focal point; a heat light source provided at the second focal point; a laser emitting a laser beam on or near the first focal point to form a melt zone in the material stick, the laser beam having a wavelength within the range of about 160 to about 1000 nm; and a drive system to move the material stick with respect to the laser beam so as to move the melt zone in the material stick.

According to the present invention, since a laser beam having a shorter wavelength and having a higher light absorption than those of a conventional YAG laser beam, an efficient growth of single crystal can be achieved, making it possible to produce a single crystal at lower costs.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Figure 1A:
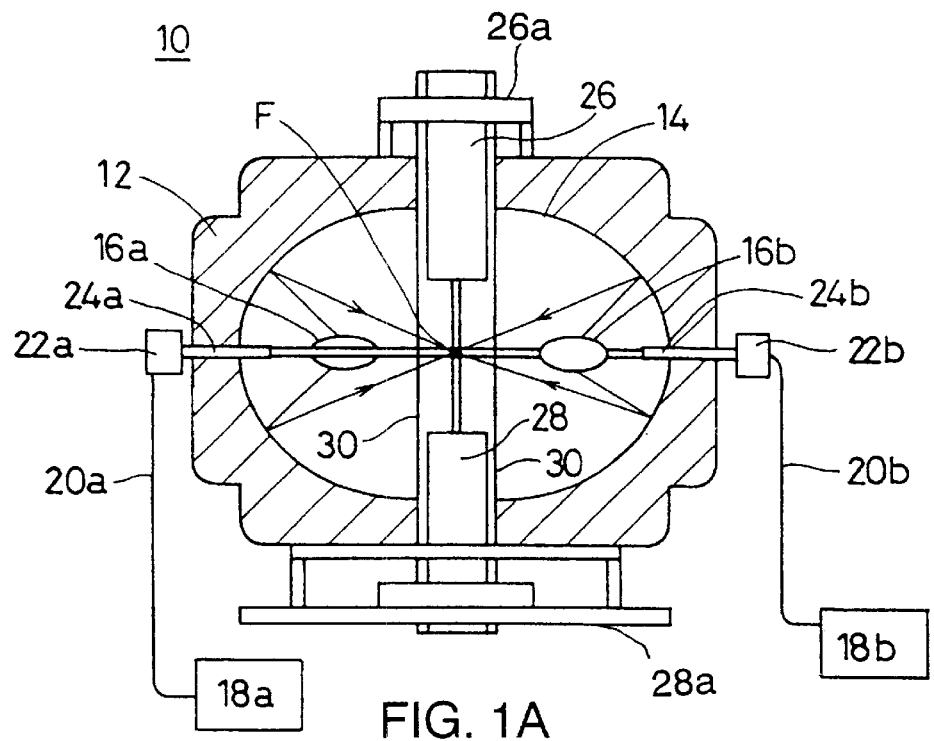
FIG. 1A is a sectional diagram showing an example of a single crystal producing apparatus according to the present invention, as viewed from the side.

A single crystal producing method according to the present invention for growing a single crystal includes placing a material at one focal point in a light-condensing and heating furnace having an ellipse in section, placing a heat light source at another focal point, emitting a laser beam on or near the one focal point to form a melt zone, and moving the melt zone, wherein the laser beam preferably has a wavelength of not less than about 160 nm and not greater than about 1,000 nm. It is more preferable that the wavelength of the laser beam is not less than about 750 nm and not greater than about 1,000 nm.

In a single crystal producing method according to the present invention, preferably, the single crystal is magnetic garnet.

Furthermore, in a single crystal producing method according to the present invention, the light-condensing and heating furnace may be shaped in section to combine a plurality of ellipses having one shared focal point.

Still further, a single crystal producing apparatus according to the present invention for growing a single crystal by placing a material at one focal point in a light-condensing and heating furnace having an ellipse in section, placing a heat light source at another focal point, emitting a laser beam on or near the one focal point to form a melt zone, and moving the melt zone, wherein the laser beam has a wavelength of not legs than about 160 nm and not greater than about 1,000 nm.

In a single crystal producing apparatus according to the present invention, the light-condensing and heating furnace may be shaped in section to combine a plurality of ellipses having one shared focal point.

Furthermore, in a single crystal producing apparatus according to the present invention, preferably, the laser beam is transmitted through an optical fiber and is condensed on the shared focal point by a lens.

A single crystal producing apparatus according to the present invention employs the principle in which light emitted from one focal point in an ellipse is reflected by the ellipse and is condensed on another focal point. For an efficient light reflection, a process to enhance the reflection on the reflection plane, such as metal plating, may be used. A mirror having a revolving ellipsoidal surface is used when light exiting from a point light source is to be condensed at a point, and an elliptically cylindrical mirror having an ellipse in section is used when light exiting from a linear light source is to be linearly condensed. In these cases, a mirror shaped in section to combine a plurality of ellipses having one shared focal point may also be used. In this case, an increased number of combined ellipses allows for improved temperature uniformity in the furnace, making it possible to increase the maximum temperature. However, an increased number more than is necessity leads to a deterioration of condensing ability, and thus the number of combined ellipses, i.e., the number of heat light sources is preferably two through six.

The number and position of the guided laser beam are not restricted in particular. However, two laser beams should not exist on the same line. If the laser beams face each other on the same line, the laser beams may be return beams, resulting in adverse effects on each other. Thus, preferably, about two or four opposing laser beams which are slightly deviated from a straight line are guided.

According to the present invention, a raw material rod and a seed crystal, which are used as raw materials to grow a single crystal, are preferably received and heated in a tube adapted to adjust the atmosphere for a growth of the single crystal. The tube is preferably made of a material having a great coefficient of transmission with respect to the wavelength zone of the laser beam and the infrared wavelength for light-condensing and heating, and, for example, a quartz tube is employed. An atmosphere gas is chosen for a growth condition of the single crystal, and is appropriately selected from, for example, oxygen, nitrogen, argon, hydrogen and a mixture thereof.

According to the present invention, the wavelength of the laser beam is preferably not less than about 160 nm and not greater than about 1,000 nm. A wavelength longer than about 1,000 nm causes materials of the raw material rod (particularly, iron garnet polycrystal such as YIG) to have a lower absorption coefficient while for a wavelength shorter than about 160 nm, inversely, when a tube (for example, a quartz tube) is used to adjust the atmosphere, the tube has an increased absorption coefficient, which is less convenient. More preferably, the wavelength is not less than about 750 nm and not greater than about 1,000 nm. This is because a laser oscillator having a short wavelength is expensive in general, and less expensive semiconductor laser has a frequency of about 750 nm or more.

Any type of laser oscillator may be available, but a laser oscillator having an output of 1 W or more is desirable to melt the raw material rod.

Preferably, light emitted from a laser beam generating element is put through an optical fiber in an advantageous manner that the light is emitted on a desired portion at a desired angle. In this regard, advantageously, the light is converted to substantially parallel light by a cylindrical lens or the like, and thereafter is put through the optical fiber. A lens for condensing the laser beam must be further disposed at an exit end of the optical fiber. This lens is used to condense the laser beam at a desired distance.

The single crystal to be grown may be either of a congruent melting material or of an incongruent melting material such as magnetic garnet. It may also be metallic. According to the present invention, the use of iron garnet is advantageous because the absorption coefficient with respect to the wavelength of about 1,000 nm or less is increased.

A polycrystal raw material rod used to grow a single crystal of ceramics provides a desirable uniform composition, and may employ ceramics having a sintered density to some extent. The sintered density is preferably about 60% or more, and more preferably about 80% or more. A polycrystal raw material rod and a seed crystal may be moved together or moved independently. Furthermore, a polycrystal raw material rod and a seed crystal are held by an upper shaft and a lower shaft moving in a light-condensing and heating furnace of a single crystal producing apparatus. Either may be above or below.

Hereinafter, a preferred embodiment of the present invention will be described in more detail, with reference to the drawings.

A single crystal producing method and a single crystal producing apparatus according to the present invention are applicable to production of single crystals of materials, such as magnetic garnet single crystals, high temperature oxide super conductors or single crystals of metal, which are crystallized by cooling the materials melted at high temperatures. The following description is made mainly on YIG by way of example.

Figure 1B:
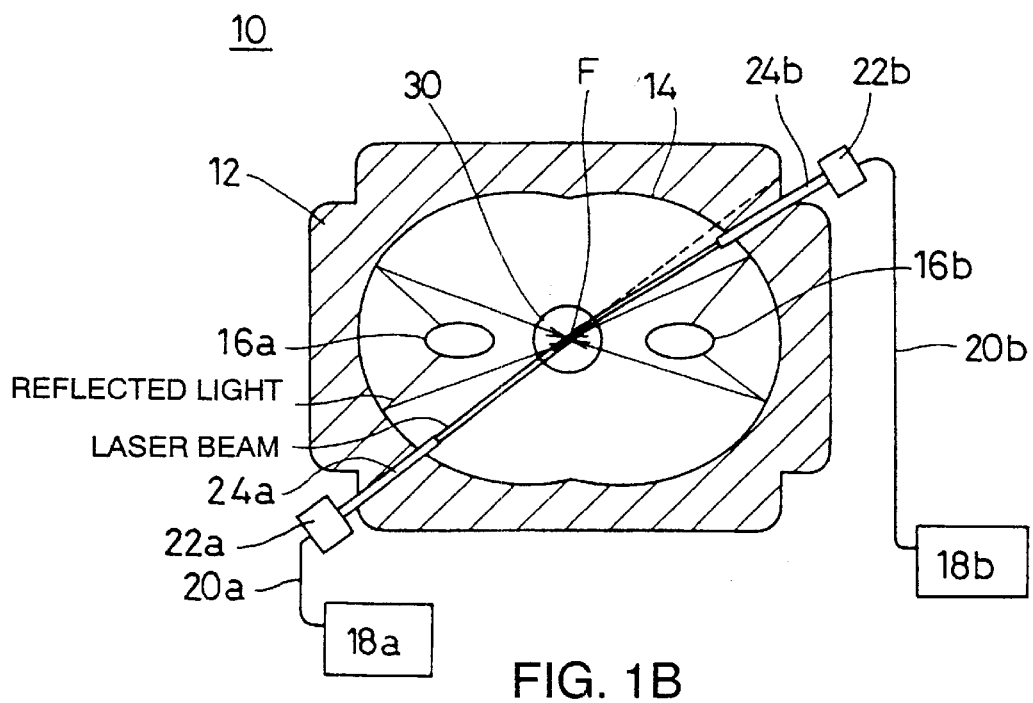
FIG. 1B is a sectional diagram thereof, as viewed from the top.

FIGS. 1A and 1B illustrate an exemplary apparatus for producing a single crystal in accordance with the present invention. A single crystal producing apparatus 10 is an LHPG (Laser Heat Pedestal Growth) apparatus. The single crystal producing apparatus 10 of the present embodiment includes a housing 12, in which a mirror 14 having a revolving bi-ellipsoidal surface formed by revolution of a bi-ellipse about the long axis thereof. The interior enclosed by the mirror 14 serves as a light-condensing and heating furnace. The bi-ellipse is indicative of a shape in combination of two ellipses having one shared focal point. The revolving bi-ellipse has a shared focal point P at which a heated portion of a single crystal growing material is positioned. The revolving bi-ellipse includes non-shared focal points at which heat light sources 16a and 16b are located. The heat light sources 16a and 16b are implemented by, for example, halogen lamps. Light emitted from the heat light sources 16a and 16b is reflected by the mirror 14, and is condensed on the shared focal point F. It will be noted that the mirror 14 is not necessarily shaped into a revolving bi-ellipse but may be a cylinder having a bi-elliptic section.

Furthermore, the number of combined ellipses is not limited on two, as above described.

The single crystal producing apparatus 10 further includes two semiconductor lager generators, i.e., 18a and 18b, each having an output of 15 W and containing GaAs with a center wavelength of 900 nm. The laser generators 18a and 18b are connected to laser-condensing lenses 22a and 22b via optical fibers 20a and 20b, respectively. Laser guide holes 24a and 24b are formed passing through the housing 12. The laser beams condensed on the condenser lenses 22a and 22b are passed through the guide holes 24a and 24b, and are condensed on or near the shared focal point F. The output of the heat light sources 16a and 16b, or of the semiconductor laser generators 18a and 18b can be adjusted to change for optimization the temperature gradient or the temperature distribution in the vicinity of a melt zone formed at the shared focal point F. Since YIG has a melting point of 1,720° C., the sample diameter, the output of the heat light sources and the output of the semiconductor lasers are appropriately selected so as to achieve heating to 1,720° C. or higher.

The single crystal producing apparatus 10 also includes an upper shaft 26 and a lower shaft 28 for holding a raw material rod and a seed crystal, respectively. The upper shaft 26 and the lower shaft 28 face each other and are aligned in a line extending vertically through the shared focal point F in the mirror 18. A raw material rod and a seed crystal are held by the upper shaft 26 and the lower shaft 28 so that the portion to be heated may be placed in position of the shared focal point F. The upper shaft 26 and the lower shaft 28 of the present embodiment are moved up and down in the axial direction by their own independent drive systems 2a and 28a. Moving the upper shaft 26 and the lower shaft 28 up and down in the axial direction allows the raw material rod and the seed crystal to move, thus allowing the portion to be heated, i.e., the melt zone, to move. A switch may be switched to move the upper shaft 26 and the lower shaft 28 in a synchronous manner and in an asynchronous manner. The moving rates of the upper shaft 26 and the lower shaft 28 may be controlled to determine the growth rate of the single crystal as well as the resultant diameter of the single crystal. These have optimal values depending upon a sintered degree and diameter of the polycrystal raw material rod, the laser output, the output of the heat light sources, a grown crystal kind, etc.

The polycrystal raw material rod is made by mixing $Fe_2O_3$ and $Y_2O_3$ having impurities of 0.1% or less at a stoichiometric ratio, so as to have a relative density of 80% or more of a theoretical density, by a typical ceramic fabrication technique. Further, it may be a round rod, a square rod, a plate or another shape, as appropriately selected. As a seed crystal, a YIG single crystal previously produced by the apparatus of the present invention may be used, or otherwise, a YIG single crystal grown by any other method and having a defined orientation, or a seed single crystal having a similar structure such as GGG ($Gd_3Ga_5O_{12}$) may also be used.

Preferably, the SSFZ (Self Solvent Floating Zone) method disclosed in Japanese Unexamined Patent Application Publication No. 10-251088 is used as a growth technique. Specifically, a single crystal is grown through the steps of joining a polycrystal raw material rod with a seed crystal, forming a melt zone on a side opposite to the joint portion of the polycrystal raw material rod, moving the melt zone to the joint portion so as to be in contact with the seed crystal for seeding, and then moving the melt zone to a side opposite to the seed crystal. However, the single crystal production of metal may be implemented by, for example, the TSFZ (Traveling Solvent Floating Zone) method which includes joining a seed crystal with a polycrystal raw material rod, and then still proceeding the growth.

The polycrystal raw material rod and the seed crystal are received and heated in a quartz tube 30 so that the atmosphere of a portion subjected to the single crystal production can be adjusted. When, for example, YIG is to be grown, $O_2$ gas is used as an atmosphere gas. The gas flow rate is typically not less than 0.1 and not greater than 10 liter/min.

EXAMPLE 1

A polycrystal raw material rod having a diameter of 0.5 mm and a length of 20 mm, and having a mixture ratio of $Fe_2O_3:Y_2O_3=5:3$, and a YIG seed crystal prepared with <111> in parallel to the moving axis were used for a growth by the SSFZ method using the apparatus shown in FIG. 1. The output of each laser beam was set at 10 W, and the output of the heat light sources was set at 500 W while the growth rate was set at 10 mm/hr. As a result, a <111> oriented single crystal of YIG was grown. The growth orientation was tested with an X-ray reflection by the Laue method.

EXAMPLE 2

A polycrystal raw material rod having a diameter of 1 mm and a length of 100 mm, and having a mixture ratio of $Fe_2O_3:Y_2O_3:Ga_2O_3=4.5:3:0.5$, and a YIG seed crystal prepared with <110> in parallel to the moving axis were used for a growth by the TSFZ method using the apparatus shown in FIG. 1. The output of the laser beams was set at 12 W each and the output of the heat light sources was set at 500 W while the growth rate was set at 9 mm/hr. As a result, a single crystal of Ga-substituted YIG was grown. Furthermore, the saturated magnetization measures 88 mT by the VSM method while Ga was substituted for an Fe site.

EXAMPLE 3

A polycrystal raw material rod having a diameter of 0.5 mm and a length of 20 mm, and having a mixture ratio of $Fe_2O_3:Y_2O_3=5:3$, and a YIG seed crystal prepared with <111> in parallel to the moving axis were used for a growth by the SSFZ method using a substitute, having a laser wavelength of 897 nm, for the apparatus shown in FIG. 1. The output of the laser beams was set at 6 W each and the output of the heat light sources was set at 500 W while the growth rate was set at 10 mm/hr. As a result, a <111> oriented single crystal of YIG was grown. The growth orientation was tested with an X-ray reflection by the Laue method.

EXAMPLE 4

A polycrystal raw material rod having a diameter of 1 mm and a length of 100 mm, and having a mixture ratio of $Y_2O_3:BaO:CuO=1:4:6$, and a seed crystal of YBCO ($YBa_2Cu_3O_x$) prepared with <100> in parallel to the moving axis were used for a growth by the SSFZ method using the apparatus shown in FIG. 1. The output of the laser beams was set at 12 W each and the output of the heat light sources was set at 500 W while the growth rate was set at 10 mm/hr. As a result, a <110> oriented single crystal of YBCO was grown.

EXAMPLE 5

A platinum wire having a diameter of 2 mm and a length of 50 mm, and a Pt seed crystal prepared with <111> in parallel to the moving axis were used for a growth by the TSFZ method using the apparatus shown in FIG. 1. The output of each laser beam was set at 10 W, and the output of the heat light sources was set at 500 W while the growth rate was set at 50 mm/hr. As a result, a <111> oriented single crystal of Pt was grown. The growth orientation was tested with an X-ray reflection by the Laue method.

COMPARATIVE EXAMPLE 1

A polycrystal raw material rod having a diameter of 0.5 mm and a length of 20 mm, and having a mixture ratio of $Fe_2O_3:Y_2O_3=5:3$, and a YIG seed crystal prepared with <111> in parallel to the moving axis were used for an attempt of growth by the SSFZ method using a YAG laser having a wavelength of 1,060 nm replaced with the laser apparatus shown in FIG. 1. The output of each laser beam was set at 10 W, and the output of the heat light sources was set at 500 W while the single crystal growing rate was set at 10 mm/hr. However, the desired single crystal was not obtained.

COMPARATIVE EXAMPLE 2

A polycrystal raw material rod having a diameter of 0.5 mm and a length of 20 mm, and having a mixture ratio of $Fe_2O_3:Y_2O_3=5:3$, and a YIG seed crystal prepared with <111> in parallel to the moving axis were used for a growth by the SSFZ method using a YAG laser replaced with the laser apparatus shown in FIG. 1. The output of each laser beam was set at 50 W, and the output of the heat light sources was set at 500 W while the single crystal growing rate was set at 5 mm/hr. As a result, an oriented single crystal of YIG was obtained.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. In a single crystal producing method for growing a single crystal, comprising placing a material from which the single crystal is to be produced at a first focal point of a furnace having an interior comprising at least one elliptical cross-section and having a heat light emitter at a second focal point, applying a laser beam on the first focal point and moving the zone of melting of the material created by the laser and heat light, the improvement which comprises employing a laser beam which has a wavelength of not less than about 160 nm and not greater than about 1,000 nm.

2. A single crystal producing method according to claim 1, wherein the laser beam has a wavelength of not less than about 750 nm and not greater than about 1,000 nm.

3. A single crystal producing method according to claim 2, wherein the single crystal is magnetic garnet.

4. A single crystal producing method according to claim 3, wherein the interior of the furnace comprises a plurality of elliptical cross sections having one shared focal point.

5. A single crystal producing method according to claim 4, wherein a seed crystal is contacted with the material from which the single crystal is to be produced.

6. A single crystal producing method according to claim 1, wherein the single crystal is magnetic garnet.

7. A single crystal producing method according to claim 1, wherein the interior of the furnace comprises a plurality of elliptical cross sections having one shared focal point.

8. A single crystal producing method according to claim 1, wherein a seed crystal is contacted with the material from which the single crystal is to be produced.

9. A single crystal producing apparatus for growing a single crystal, comprising:
a light-condensing and heating furnace whose interior has an ellipse section and contains first and second focal points on which light is condensed,
a material from which the single crystal is to be produced movably disposed at the first focal point,
a heat light source disposed at the second focal point and
a laser adapted to apply a laser beam at about the first focal point to form a melt zone in the material, wherein the laser beam has a wavelength within the range of about 160 to about 1000 nm.

10. A single crystal producing apparatus according to claim 9, wherein said light-condensing and heating furnace interior comprises a plurality of ellipses sections having a shared focal point.

11. A single crystal producing apparatus according to claim 10, having an optical fiber and lens adapted to transmit a laser beam from the laser to the shared focal point.

12. A single crystal producing apparatus according to claim 11, wherein the laser beam has a wavelength of not less than about 750 nm and not greater than about 1,000 nm.

13. A single crystal producing apparatus according to claim 12, wherein the material is magnetic garnet.

14. A single crystal producing apparatus according to claim 13, having a pair of lasers adapted to transmit laser beams from each respective laser to about the first focal point.

15. A single crystal producing apparatus according to claim 14, wherein the pair of lasers are disposed exterior to the light-condensing and heating furnace.

16. A single crystal producing apparatus according to claim 9, having an optical fiber and lens adapted to transmit a laser beam from the laser to about the first focal point.

17. A single crystal producing apparatus according to claim 9, wherein the laser beam has a wavelength of not less than about 750 nm and not greater than about 1,000 nm.

18. A single crystal producing apparatus according to claim 9, wherein the material is magnetic garnet.

* * * * *